(12) United States Patent
Meiser et al.

(10) Patent No.: US 10,985,245 B2
(45) Date of Patent: Apr. 20, 2021

(54) SEMICONDUCTOR DEVICE WITH PLANAR FIELD EFFECT TRANSISTOR CELL

(71) Applicant: Infineon Technologies AG, Neubiberg (DE)

(72) Inventors: Andreas Meiser, Sauerlach (DE); Christian Kampen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/220,693

(22) Filed: Dec. 14, 2018

(65) Prior Publication Data

US 2019/0189742 A1 Jun. 20, 2019

(30) Foreign Application Priority Data

Dec. 15, 2017 (DE) .......................... 102017130223.9

(51) Int. Cl.

| H01L 29/06 | (2006.01) |
|---|---|
| H01L 29/08 | (2006.01) |
| H01L 29/10 | (2006.01) |
| H01L 29/40 | (2006.01) |
| H01L 29/78 | (2006.01) |
| H01L 29/423 | (2006.01) |

(52) U.S. Cl.
CPC ...... *H01L 29/0696* (2013.01); *H01L 29/0653* (2013.01); *H01L 29/1033* (2013.01); *H01L 29/1095* (2013.01); *H01L 29/402* (2013.01); *H01L 29/42364* (2013.01); *H01L 29/7835* (2013.01)

(58) Field of Classification Search
CPC combination set(s) only.
See application file for complete search history.

(56) References Cited

U.S. PATENT DOCUMENTS

| 5,156,989 | A | 10/1992 | Williams et al. | |
|---|---|---|---|---|
| 5,374,843 | A | 12/1994 | Williams et al. | |
| 5,973,367 | A * | 10/1999 | Williams | ............ H01L 27/0629 |
| | | | | 257/133 |
| 6,020,227 | A * | 2/2000 | Bulucea | .......... H01L 21/823412 |
| | | | | 257/E21.427 |
| 6,545,316 | B1 | 4/2003 | Baliga | |
| 6,911,696 | B2 | 6/2005 | Denison | |

(Continued)

FOREIGN PATENT DOCUMENTS

| DE | 10210662 A1 | 9/2002 |
|---|---|---|
| DE | 102008038300 A1 | 3/2010 |
| WO | 2005045938 A2 | 5/2005 |

*Primary Examiner* — Kenneth Parker
*Assistant Examiner* — Long H Le
(74) *Attorney, Agent, or Firm* — Murphy, Bilak & Homiller, PLLC

(57) ABSTRACT

The disclosure relates to a semiconductor device including a first planar field effect transistor cell and a second planar field effect transistor cell. The first planar field effect transistor cell and the second planar field effect transistor cell are electrically connected in parallel and each include a drain extension region between a channel region and a drain terminal at a first surface of a semiconductor body. A gate electrode of the first field effect transistor cell is electrically connected to a source terminal, and a gate electrode of the second field effect transistor cell is connected to a gate terminal that is electrically isolated from the source terminal.

18 Claims, 6 Drawing Sheets

(56) References Cited

U.S. PATENT DOCUMENTS

| | | |
|---|---|---|
| 8,564,057 B1 | 10/2013 | Darwish et al. |
| 8,618,606 B2 | 12/2013 | Risaki et al. |
| 8,692,324 B2 | 4/2014 | Korec et al. |
| 8,963,241 B1 | 2/2015 | Khemka et al. |
| 8,994,113 B2 | 3/2015 | Strasser et al. |
| 9,306,060 B1 | 4/2016 | Yang et al. |
| 9,559,187 B2 | 1/2017 | Ko et al. |
| 9,871,132 B1 | 1/2018 | Liu et al. |
| 9,923,092 B2 | 3/2018 | Yao et al. |
| 10,128,331 B1 | 11/2018 | Wu et al. |
| 10,217,862 B2 | 2/2019 | Mori et al. |
| 2001/0048122 A1 | 12/2001 | Tada et al. |
| 2002/0053695 A1 | 5/2002 | Liaw et al. |
| 2005/0067655 A1 | 3/2005 | Shibib et al. |
| 2005/0118753 A1 | 6/2005 | Efland et al. |
| 2006/0124999 A1 | 6/2006 | Pendharkar |
| 2007/0069308 A1 | 3/2007 | Ko |
| 2008/0014690 A1 | 1/2008 | Chu et al. |
| 2009/0218622 A1 | 9/2009 | Rijs et al. |
| 2009/0256199 A1 | 10/2009 | Denison et al. |
| 2009/0256212 A1* | 10/2009 | Denison ............ H01L 29/7825 257/408 |
| 2009/0283825 A1 | 11/2009 | Wang et al. |
| 2010/0001343 A1 | 1/2010 | Kim et al. |
| 2010/0155830 A1 | 6/2010 | Takahashi |
| 2011/0101454 A1 | 5/2011 | Ichijo et al. |
| 2012/0181629 A1 | 7/2012 | Su et al. |
| 2012/0187485 A1 | 7/2012 | Morioka |
| 2013/0020632 A1 | 1/2013 | Disney |
| 2013/0140632 A1 | 6/2013 | Landgraf et al. |
| 2013/0181285 A1 | 7/2013 | Ng et al. |
| 2013/0277741 A1 | 10/2013 | Guowei et al. |
| 2013/0292763 A1 | 11/2013 | Chang et al. |
| 2014/0097492 A1 | 4/2014 | Yu |
| 2014/0103968 A1 | 4/2014 | Heringa et al. |
| 2014/0264587 A1 | 9/2014 | Moon |
| 2014/0284701 A1 | 9/2014 | Korec |
| 2014/0339632 A1 | 11/2014 | Yu |
| 2014/0361374 A1 | 12/2014 | Knaipp |
| 2014/0367778 A1 | 12/2014 | Sharma et al. |
| 2015/0008539 A1 | 1/2015 | Kanda et al. |
| 2015/0076593 A1 | 3/2015 | Darwish et al. |
| 2015/0091088 A1 | 4/2015 | Vielemeyer et al. |
| 2015/0097236 A1 | 4/2015 | Tsai et al. |
| 2015/0243777 A1 | 8/2015 | Fujii |
| 2015/0243783 A1 | 8/2015 | Lee et al. |
| 2015/0270390 A1 | 9/2015 | Kaya et al. |
| 2015/0357404 A1 | 12/2015 | Sato et al. |
| 2016/0043708 A1 | 2/2016 | Heringa et al. |
| 2016/0190310 A1 | 6/2016 | Yu et al. |
| 2016/0247913 A1 | 8/2016 | Wang et al. |
| 2016/0315188 A1 | 10/2016 | Disney et al. |
| 2016/0336308 A1 | 11/2016 | Esmark et al. |
| 2016/0351704 A1 | 12/2016 | Duan et al. |
| 2017/0025532 A1 | 1/2017 | Mori et al. |
| 2017/0047442 A1 | 2/2017 | Kumano |
| 2017/0062607 A1* | 3/2017 | Girdhar ............... H01L 29/0882 |
| 2017/0062608 A1 | 3/2017 | Mori |
| 2017/0092726 A1 | 3/2017 | Nidhi et al. |
| 2017/0125582 A1 | 5/2017 | Murukesan et al. |
| 2017/0170284 A1 | 6/2017 | Li et al. |
| 2017/0221885 A1 | 8/2017 | Sander et al. |
| 2017/0229536 A1 | 8/2017 | Stuber et al. |
| 2017/0263766 A1 | 9/2017 | Xia et al. |
| 2017/0345887 A1 | 11/2017 | Ichikawa |
| 2017/0372985 A1 | 12/2017 | Birner et al. |
| 2017/0373138 A1 | 12/2017 | Birner et al. |
| 2018/0033854 A1 | 2/2018 | Kaya et al. |
| 2018/0090455 A1 | 3/2018 | Brecfi et al. |
| 2018/0190763 A1 | 7/2018 | Yang et al. |
| 2018/0240737 A1 | 8/2018 | Tu et al. |
| 2019/0058039 A1 | 2/2019 | Cai |
| 2019/0123555 A1 | 4/2019 | Kim et al. |
| 2019/0181227 A1 | 6/2019 | Lee |
| 2019/0189742 A1 | 6/2019 | Meiser et al. |
| 2019/0189743 A1 | 6/2019 | Meiser et al. |
| 2019/0334031 A1 | 10/2019 | Ningaraju et al. |
| 2019/0393339 A1 | 12/2019 | Lin et al. |
| 2020/0075760 A1 | 3/2020 | Braun et al. |
| 2020/0144381 A1 | 5/2020 | Braun et al. |

* cited by examiner

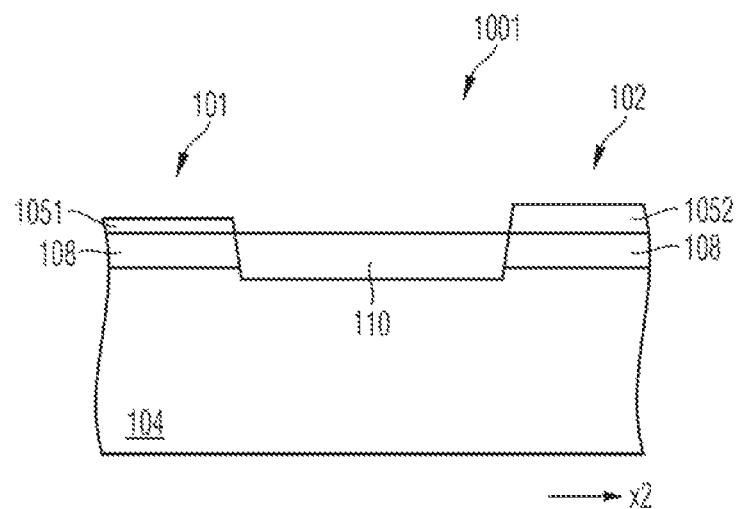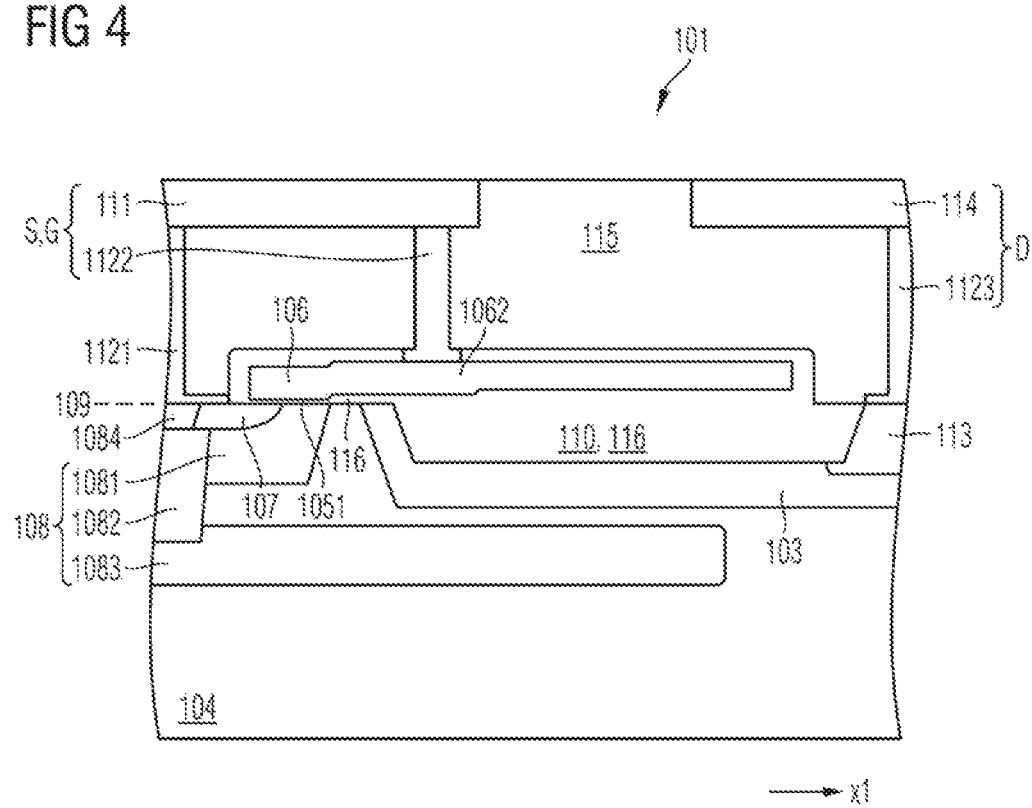

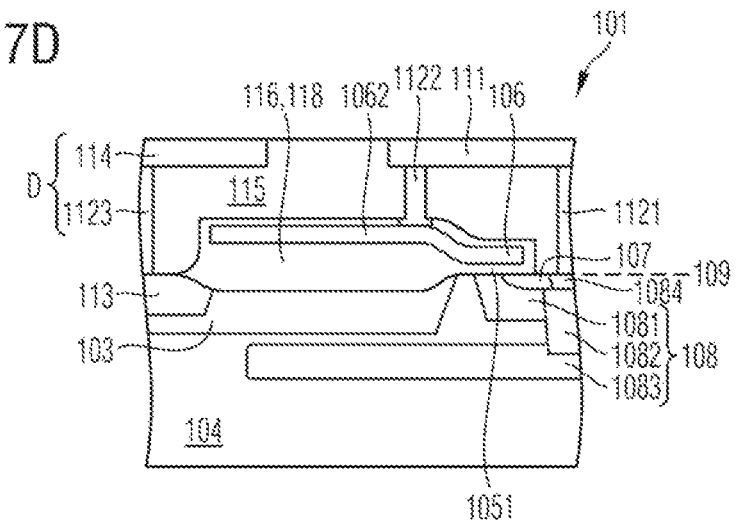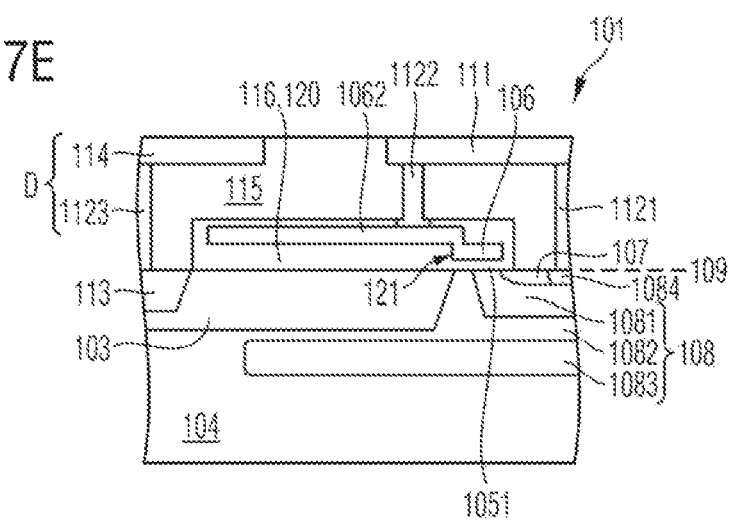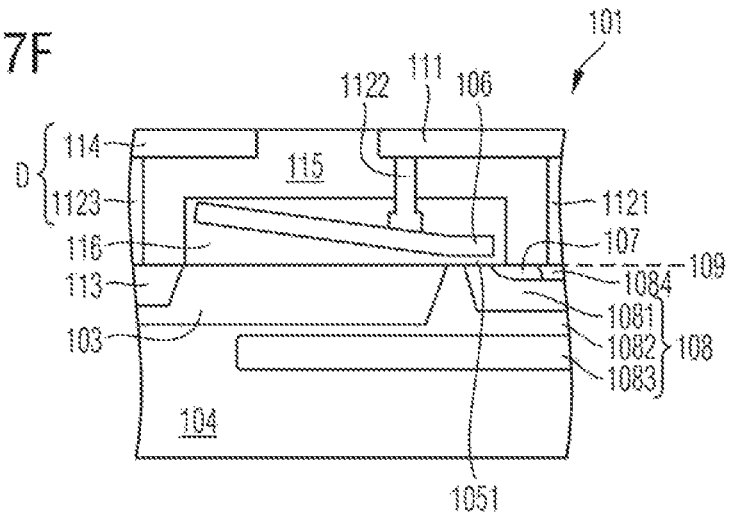

SEMICONDUCTOR DEVICE WITH PLANAR FIELD EFFECT TRANSISTOR CELL

TECHNICAL FIELD

The application relates to a semiconductor device with a planar field effect transistor cell.

BACKGROUND

In semiconductor components comprising field effect transistors, a multiplicity of field effect transistor cells is typically connected in parallel in order to realize a desired current-carrying capacity. In circuit applications such as DC-DC converters, for instance, the transistors are optimized for example so as to minimize losses that occur in each switching cycle. Different switching states are undergone during each cycle, wherein different loss portions arise in each switching phase, which loss portions can be increased or decreased by specific transistor parameters. During one of these phases, in the exemplary case of a DC-DC converter, the current flows in a reverse direction through the field effect transistor cells with the channel closed, wherein the body diode is operated in the forward direction.

It is desirable to reduce the power loss of field effect transistor cells in order thereby to improve the efficiency of a circuit arrangement realized with the field effect transistor cells.

SUMMARY

The present disclosure relates to a semiconductor device comprising a first planar field effect transistor cell and a second planar field effect transistor cell. The first planar field effect transistor cell and the second planar field effect transistor cell are electrically connected in parallel and each comprise a drain extension region between a channel region and a drain terminal at a first surface of a semiconductor body. A gate electrode of the first field effect transistor cell is electrically connected to a source terminal, and a gate electrode of the second field effect transistor cell is connected to a gate terminal that is electrically isolated from the source terminal. The first field effect transistor cell is interconnected as a so-called MOS (metal-oxide-semiconductor) gated diode, MGD, on account of the electrical connection between the source terminal and the gate electrode. Said MGD is electrically connected in parallel with the second field effect transistor cell. Parallel connection of a suitable multiplicity of the second field effect transistor cells makes it possible for example to set a current-carrying capacity of a power transistor to be formed, wherein the first field effect transistor cell acting as MGD serves to reduce the power loss during reverse operation of the field effect transistor cells, i.e. in the operating mode in which a body diode is operated in the forward direction.

In accordance with one embodiment, the drain extension region is suitable for blocking a drain-to-source voltage in a range of 5 V to 200 V. The desired voltage blocking range can be set by means of a suitable dimensioning and doping of the drain extension region. Consequently, the field effect transistor cells can be used for example in circuit applications such as DC-DC converters.

The present disclosure furthermore relates to a semiconductor device comprising a first planar field effect transistor cell comprising a drain extension region between a channel region and a drain terminal at a first surface of a semiconductor body. A gate electrode of the first field effect transistor cell is electrically connected to a source terminal, and the drain extension region is suitable for blocking a drain-to-source voltage in a range of 5 V to 200 V.

In accordance with one embodiment, a first thickness of a first gate dielectric arranged on the channel region of the first planar field effect transistor cell is less than a second thickness of a second gate dielectric arranged on the channel region of the second planar field effect transistor cell; it is thus possible to lower a threshold voltage Vth of the first field effect transistor cell interconnected as MGD by comparison with the second field effect transistor cell serving as load transistor and to achieve a reduction in the power loss during reverse operation of the field effect transistor cells, i.e. with the body-drain diode operated in the forward direction, by virtue of the fact that the current flow through the first field effect transistor cell acting as MGD already commences below the forward voltage of the body-drain diode.

In accordance with one embodiment, a ratio of second thickness to first thickness lies in a range of 2 to 20. This makes it possible advantageously to lower the threshold voltage Vth of the first field effect transistor cell interconnected as MGD by comparison with the second field effect transistor cell carrying a load current.

In accordance with one embodiment, a body region of the first field effect transistor cell and a body region of the second field effect transistor cell, from opposite sides, laterally adjoin a component isolation region formed between the first planar field effect transistor cell and the second planar field effect transistor cell. The component isolation region can both serve for electrical isolation between first and second field effect transistor cells and entail advantages with regard to processing, e.g. patterning of an electrode formed above the gate dielectrics of the first and second planar field effect transistor cells, e.g. of a gate electrode composed of polycrystalline silicon.

In accordance with one embodiment, a first lateral direction extends along a channel length direction of the channel region perpendicular to a channel width direction, and lateral dimensions of doped semiconductor regions of the first planar field effect transistor cell along the first lateral direction correspond to lateral dimensions of corresponding doped semiconductor regions of the second planar field effect transistor cell along the first lateral direction. It is thus possible for example to position the first field effect transistor cells acting as MGD as strip or ring segments between the strip or ring segments of the second field effect transistor cells acting as load transistor and thus to achieve an advantageous homogeneous current distribution during forward operation of the body-drain diode.

In accordance with a further embodiment, an electrode material forming the gate electrode of the first planar field effect transistor cell extends from the gate electrode of the first planar transistor cell to above the drain extension region of the second planar field effect transistor cell and forms there a field plate formed between the drain terminal and the gate electrode of the second planar field effect transistor cell. This enables a very compact arrangement of the first and second field effect transistor cells with electric field shielding at the same time.

In accordance with a further embodiment, the second planar field effect transistor cell is part of a lateral power transistor having a multiplicity of parallel-connected field effect transistor cells that are suitable for switching load currents of greater than 100 mA. Consequently, the semiconductor device is suitable for a multiplicity of power semiconductor applications such as DC-DC converters, for instance.

In accordance with a further embodiment, the semiconductor device additionally comprises a deep body region, which is electrically connected to the source terminal and extends below the drain extension region of the first planar field effect transistor cell in a first lateral direction along a channel length direction of the channel region perpendicular to a channel width direction, wherein an extent of the deep body region in the first lateral direction and an extent of the drain extension region in the first lateral direction at least partly overlap. The partial overlap has a positive effect on the blocking capability of the lateral field effect transistor cell on account of the compensation principle or RESURF (REduced SURface Field) principle. The extent of the deep body region in the first lateral direction and an extent of the gate electrode in the first lateral direction can likewise overlap, for example.

In accordance with a further embodiment, a threshold voltage of the first planar field effect transistor cell is less than a forward voltage of a body-drain diode of the first planar field effect transistor cell. As a result, in the case of the first field effect transistor cell acting as MGD, it is possible to achieve a reduction of the power loss during reverse operation of the field effect transistor cells, i.e. in the operating mode in which the body-drain diode is operated in the forward direction.

In accordance with a further embodiment, an electrode material forming the gate electrode of the first planar field effect transistor cell extends from the gate electrode of the first planar transistor cell to above the drain extension region of the first planar field effect transistor cell and forms there a field plate formed between the drain terminal and the gate electrode of the second planar field effect transistor cell. The semiconductor device additionally comprises a further dielectric, which laterally adjoins the gate dielectric of the first transistor cell and is formed vertically between the field plate and the drain extension region of the first planar field effect transistor cell, wherein a thickness of the further dielectric is greater than a thickness of the gate dielectric of the first planar field effect transistor cell. As a result, a better electric field shielding can be achieved in the region of the channel end and of the drain extension region.

In accordance with one embodiment, the further dielectric comprises an STI dielectric, Shallow Trench Isolation dielectric. The further dielectric between the STI dielectric and the gate dielectric can additionally comprise a planar dielectric that is thicker than the gate dielectric of the first field effect transistor cell, i.e. thicker than the first gate dielectric.

In accordance with one embodiment, a part of the gate dielectric of the first planar field effect transistor cell at the first surface adjoins a top side of a part of the drain extension region of the first field effect transistor cell.

The further dielectric can be for example a LOCOS oxide, Local Oxidation of Silicon oxide. Likewise, the further dielectric can comprise a planar dielectric, the underside of which transitions into an underside of the first gate dielectric without any steps, and the top side of which transitions into a top side of the first gate dielectric via a step directed toward the first surface.

In accordance with one embodiment, a thickness of the further dielectric increases in a direction toward the drain terminal. An underside of the further dielectric extends for example parallel to the first surface, and a top side of the further dielectric falls for example obliquely with respect to the top side of the gate dielectric of the first planar field effect transistor cell.

The semiconductor device can be used in a multiplicity of applications. In accordance with one embodiment, by way of example, a DC-DC converter comprises one of the above-described embodiments of the semiconductor device.

BRIEF DESCRIPTION OF THE DRAWINGS

The accompanying drawings serve to afford an understanding of exemplary embodiments of the invention, are included in the disclosure and form part thereof. The drawings merely illustrate exemplary embodiments and together with the description serve to elucidate the latter. Further exemplary embodiments and numerous advantages from among those intended are evident directly from the following detailed description. The elements and structures shown in the drawings are not necessarily illustrated in a manner true to scale with respect to one another. Identical reference signs refer to identical or mutually corresponding elements and structures.

FIG. 3 is a schematic cross-sectional view of a semiconductor device in which the body region of the first field effect transistor cell and the body region of the second field effect transistor cell, from opposite sides, laterally adjoin a component isolation region formed between the first planar field effect transistor cell and the second planar field effect transistor cell.

FIG. 4 is a schematic cross-sectional view concerning one embodiment of a planar first field effect transistor cell interconnected as MGD.

FIGS. 7A to 7F show schematic cross-sectional views of the planar first field effect transistor cell for illustrating embodiments with regard to the electrical insulation at the surface of the semiconductor body between the source terminal and the drain terminal.

DETAILED DESCRIPTION

In the following detailed description, reference is made to the accompanying drawings, which form part of the disclosure and show specific exemplary embodiments for illustration purposes. In this context, a direction terminology such as "top side", "bottom", "front side", "rear side", "at the front", "at the back", etc. is related to the orientation of the figures currently being described. Since the component parts of the exemplary embodiments can be positioned in different orientations, the direction terminology is used only for explanation purposes and should in no way be interpreted as limiting.

It goes without saying that further exemplary embodiments exist and structural or logical changes can be made to the exemplary embodiments, without departing in the process from what is defined by the patent claims. The description of the exemplary embodiments is non-limiting in this respect. In particular, elements from exemplary embodiments described below can be combined with elements from other exemplary embodiments from among those described, unless something different is evident from the context.

The terms "have", "contain", "encompass", "comprise" and the like hereinafter are open terms which on the one hand indicate the presence of the stated elements or features, and on the other hand do not exclude the presence of further elements or features. The indefinite articles and the definite articles encompass both the plural and the singular, unless something different is unambiguously evident from the context.

The terms "have", "contain", "encompass", "comprise" and similar terms are open terms, and the terms indicate the presence of the stated structures, elements or features, but do not exclude additional elements or features. The indefinite articles and the definite articles are intended to encompass both the plural and the singular, unless something different is clearly evident from the context.

The term "electrically connected" describes a permanent low-impedance connection between electrically connected elements, for example a direct contact between the relevant elements or a low-impedance connection via a metal and/or a highly doped semiconductor. The term "electrically coupled" encompasses the fact that one or more intervening elements suitable for signal transmission can be present between the electrically coupled elements, for example elements that are controllable in order to provide at times a low-impedance connection in a first state and a high-impedance electrical decoupling in a second state.

Figure 1:
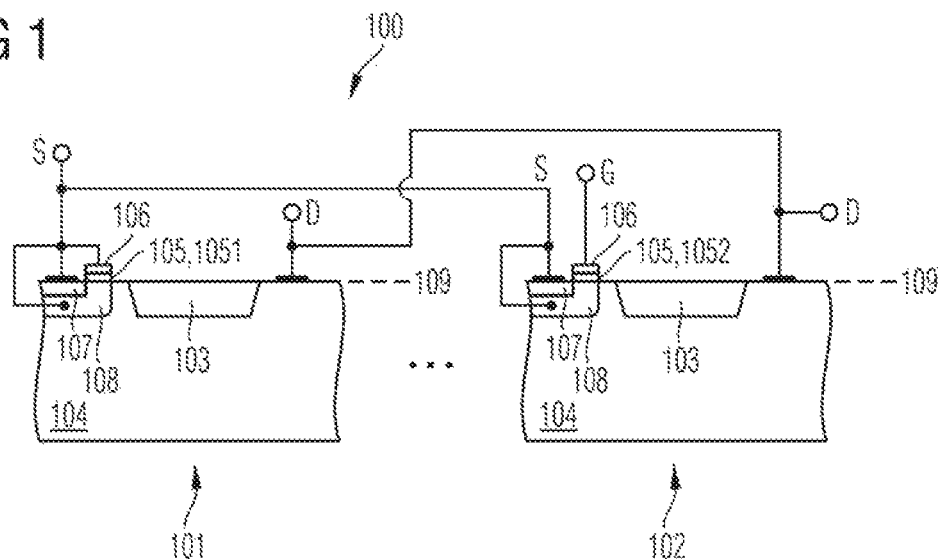
FIG. 1 is a schematic cross-sectional view of a semiconductor device having a first planar field effect transistor cell and a second planar field effect transistor cell, which are electrically connected in parallel and each comprise a drain extension region.

FIG. 1 illustrates a semiconductor device 100 in a schematic cross-sectional view. The semiconductor device 100 comprises a first planar field effect transistor cell 101 and a second planar field effect transistor cell 102, which are electrically connected in parallel and each comprise a drain extension region 103.

Planar field effect transistor cell denotes a field effect transistor cell in which a gate dielectric and a gate electrode are produced using planar technology, such that they are positioned on a semiconductor substrate and, unlike in the case of trench gate structures, are not present in a trench extending into the semiconductor substrate.

The first and second field effect transistor cells 101, 102 in FIG. 1 thus comprise a semiconductor body 104, on which a gate dielectric 105 is formed for each of the two first and second field effect transistor cells 101, 102. The gate dielectric 105 assigned to the first field effect transistor cell 101 is also referred to as first gate dielectric 1051 and the gate dielectric 105 assigned to the second field effect transistor cell 102 is also referred to as second gate dielectric 1052. The gate dielectric 105 can be for example an insulation material such as an oxide, e.g. $SiO_2$, a nitride, e.g. $Si_3N_4$, a high-k dielectric or a low-k dielectric or else an arbitrary combination thereof. By way of example, the gate dielectric 105 is formed as thermal oxide. A gate electrode 106 is positioned on the gate dielectric 105. The gate electrode 106 is formed for example from a conductive material, e.g. from a highly doped semiconductor material, such as, for instance, highly doped polycrystalline silicon, a metal, a metal silicide, a metal alloy or an arbitrary combination thereof.

The semiconductor body 104 can be based on various semiconductor materials, such as, for instance, silicon, silicon-on-insulator (SOI), silicon-on-sapphire (SOS), silicon-germanium, germanium, gallium arsenide, silicon carbide, gallium nitride or else further compound semiconductor materials. The semiconductor body can be based on a semiconductor substrate such as, for instance, a semiconductor wafer and comprise one or more epitaxial layers deposited thereon or else be thinned back. A conductivity type of the drain extension region 103 corresponds to a part of the semiconductor body 104 that surrounds the drain extension region 103. However, for example, a doping concentration in the drain extension region 103 can turn out to be comparatively higher.

The first and second field effect transistor cells 101, 102 can be for example field effect transistor cells embodied in the form of a strip or a strip segment. It goes without saying that the field effect transistor cells can also have any other form, e.g. be circular, elliptic, polygonal such as, for instance, octahedral. Moreover, the first and second field effect transistor cells 101, 102 can be arranged alternately along a direction of extent, e.g. of a strip.

The gate electrode 106 of the first field effect transistor cell 101 is electrically connected to a source terminal S. The source terminal S is for example a conductive structure that can comprise conductive components electrically connected to one another, such as, for instance, contact plugs, metallization tracks and terminal pads. The conductive component parts in turn consist of conductive material such as, for instance, a metal, a metal silicide, a metal alloy, a highly doped semiconductor or a combination thereof. Besides the source terminal S, each of the first and second field effect transistor cells 101, 102 comprises a drain terminal D. The indications given for the source terminal S with regard to material and structure are applicable to the drain terminal D.

The source terminal S is electrically connected to a source region 107 of a first conductivity type and electrically connected to a body region 108 of a second conductivity type. The first conductivity type corresponds to the conductivity type of the drain extension region 103. The electrical connection between the body region 108 and the source terminal S is illustrated in a simplified manner in FIG. 1 and can be realized in diverse ways in practice. By way of example, the source terminal S can comprise a trench contact that extends into the semiconductor body 104 and electrically contacts the body region 108 via a bottom of the trench contact and a part of the sidewall. Likewise, the body region 108 can be electrically contacted for example by virtue of the fact that the source region 107 and the body region 108 are led along a direction directed perpendicular to the plane of the drawing in FIG. 1, e.g. along a strip in the case of a strip-shaped configuration of the field effect transistor cells 101, 102, alternately to a surface 109 of the semiconductor body 104 and are in electrical contact there with the source terminal S. For this purpose, the source region 107, along a direction directed perpendicular to the plane of the drawing in FIG. 1, is embodied in the form of segments spaced apart from one another, between which segments the contact region for the body region 108 is then situated. Moreover, the body region 108 and the source region 107 at the first surface 109 can laterally adjoin one another and each be in electrical contact with the source terminal S.

The first field effect transistor cell 101 is interconnected as a so-called MOS (metal-oxide-semiconductor) gated diode, MGD, on account of the electrical connection between the source terminal S and the gate electrode 106. Said MGD is electrically connected in parallel with the second field effect transistor cell 102. In the case of the second field effect transistor cell 102, the gate electrode 106 is connected to a gate terminal G that is electrically isolated from the source terminal S. The explanations given in association with the source terminal S with regard to materials and structure are applicable to the gate terminal G. Parallel connection of a suitable multiplicity of the second field effect transistor cells 102 makes it possible to set for example a current-carrying capacity of a power transistor to be formed.

The first and second field effect transistor cells 101, 102 can be realized for instance monolithically using a mixed technology. Such mixed technologies make it possible, in one chip, for example, to form analog blocks by means of the bipolar components contained in this technology for interfaces to digital systems, digital blocks by means of the CMOS (Complementary Metal-Oxide-Semiconductor) components contained in this technology for signal processing, and also high-voltage or power blocks by means of field effect transistors contained in this technology. Such mixed technologies are known for example as bipolar-CMOS-DMOS, BCD technologies or smart power technologies, SPT, and are used in a multiplicity of fields of application in the area of e.g. lighting, motor control, automotive electronics, power management for mobile devices, audio amplifiers, power supply, hard disks, printers.

The drain extension region 103 is a semiconductor region of the first conductivity type that carries away the channel current emerging at the end of the channel to the drain terminal D. In a manner similar to how a drift zone in a vertical power semiconductor component serves to carry away the channel current in a vertical direction to the drain terminal, the drain extension region 103 serves as a drift zone in which a load current is passed in a lateral direction to the drain terminal D. In a manner similar to the drift zone in vertical power semiconductor components, the drain extension region 103 in the first and second planar field effect transistor cells 101, 102 also makes a significant contribution to the blocking capability of these components, i.e. the maximum drain-to-source voltage during operation, which is typically specified in the data sheet of the components. Said blocking capability can be set by means of suitable dimensioning and doping of the drain extension region 103. In one embodiment, the drain extension region is suitable for blocking a drain-to-source voltage in a range of 5 V to 200 V.

A channel region in the first and second field effect transistor cells 101, 102 forms in that part of the body region 108 which overlaps the gate dielectric 105 and the gate electrode 106 at the interface with the gate dielectric 105, i.e. at the first surface 104. In the second field effect transistor cell 102, the channel conductivity can be controlled by applying a suitable voltage to the gate electrode G, such that the transistor can be operated in an off state and in an on state by a suitable choice of the voltage at the gate electrode G. In a normally off n-channel FET, i.e. an enhancement-mode n-channel FET, a conducting channel arises for example if a positive voltage between the gate terminal G and the source terminal S exceeds a threshold voltage Vth.

In one embodiment, the gate dielectric 105 of the first field effect transistor cell 101 is embodied as first gate dielectric 1051 and the gate dielectric 105 of the second field effect transistor cell 102 is embodied as second gate dielectric 1052, wherein a first thickness of the first gate dielectric 1051 arranged on the channel region of the first planar field effect transistor cell 101 is less than a second thickness of the second gate dielectric 1052 arranged on the channel region of the second planar field effect transistor cell 102. As a result, it is possible to lower the threshold voltage Vth of the first transistor cell 101 interconnected as MGD by comparison with the second field effect transistor cell 102 serving as load transistor.

By way of example, in order to produce the first gate dielectric 1051, it is possible to have recourse to process steps of the CMOS process used in the mixed technology, e.g. BCD or SPT, wherein gate dielectrics whose thickness is less than the thickness of the gate dielectrics used for the load transistors are typically used for realizing the logic PMOS transistors and logic NMOS transistors.

In one embodiment, a ratio of second thickness to first thickness lies in a range of 2 to 20.

It is thus possible to reduce the threshold voltage Vth of the first field effect transistor cell 101 interconnected as MGD by comparison with the second field effect transistor cell 102 used for the load transistor, such that a current flow via the first field effect transistor cell 101 acting as MGD already commences before a current flow commences via the body-drain diode that forms between the body region 108 of the second conductivity type and the part, surrounding the body region 108, of the semiconductor body 104 of the second conductivity type. The electrical losses can be reduced as a result.

Figure 2:
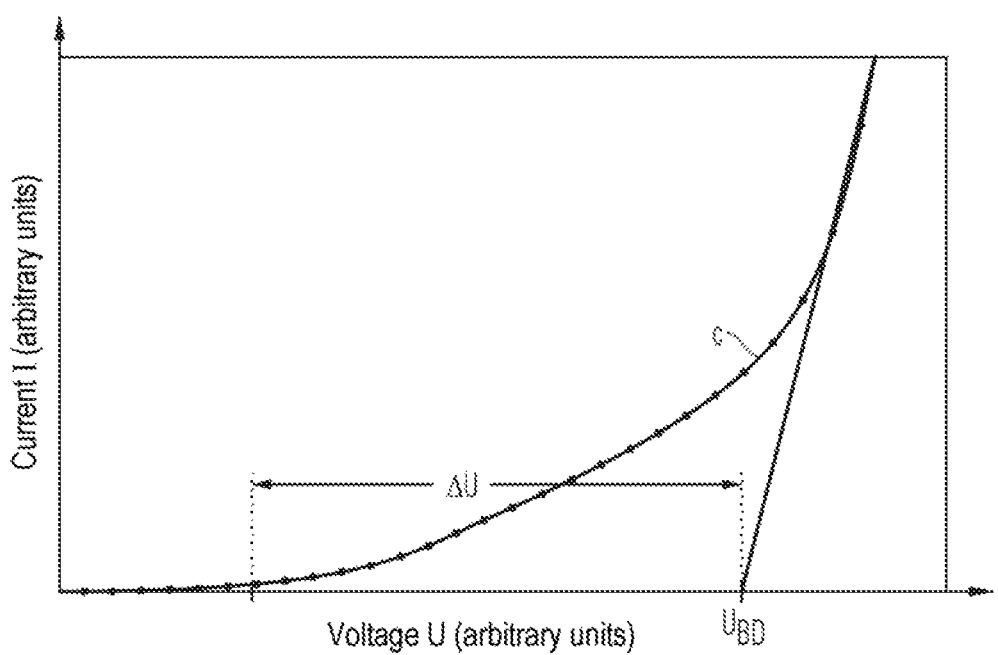
FIG. 2 shows a diagram which schematically illustrates a current flow via the first transistor cell acting as MGD, said current flow already commencing at an early stage during reverse operation of the field effect transistor cells from FIG. 1, wherein the current I is plotted against the voltage U.

The current flow via the first transistor cell 101 acting as MGD, said current flow already commencing at an early stage during reverse operation of the field effect transistor cells, is illustrated schematically in the diagram shown in FIG. 2, wherein the current I is plotted against the voltage U. A curve c identifies the profile of the current against the voltage for a semiconductor component as shown in FIG. 1.

Even before a diode current flow through the body-drain diode commences, starting from a voltage $U_{BD}$, in the voltage range identified by ΔU, a current already flows through the first field effect transistor cell 101 interconnected as MGD from FIG. 1. This makes possible the technical advantage of a reduction of the power loss and hence an increase in the efficiency of a circuit arrangement realized with the first and second planar field effect transistor cells 101, 102.

One embodiment relates to the first field effect transistor cell 101 shown in FIG. 1 and interconnected as MGD, the drain extension region 103 of which first field effect transistor cell is suitable for blocking a drain-to-source voltage in a range of 5 V to 200 V. In the case of an n-channel field effect transistor cell, the interconnection of source and gate forms an anode, and the drain terminal D forms a cathode.

The cross-sectional view of a semiconductor device 1001 as shown in FIG. 3 illustrates an embodiment in which the body region 108 of the first field effect transistor cell 101 and the body region 108 of the second field effect transistor cell 102, from opposite sides, laterally adjoin a component isolation region formed between the first planar field effect transistor cell 101 and the second planar field effect transistor cell 102. The component isolation region is embodied for example as Shallow Trench Isolation, STI region 110. The second lateral direction x2 identified in FIG. 1 can be for example a channel width direction or a direction along which strip or ring segments from first and second field effect transistor cells 101, 102 are arranged alternately. By way of example, besides an advantageous electrical insulation between the first and second field effect transistor cells

101, 102, the arrangement of the STI region 110 between the first and second field effect transistor cells 101, 102 also enables an advantageous patterning of the electrode layer, e.g. polysilicon layer, which is formed above the STI region 110 and from which for example the gate electrode 106 shown in FIG. 1 is formed.

The cross-sectional view in FIG. 4 illustrates one embodiment of a planar first field effect transistor cell 101 interconnected as MGD.

The body region 108 comprises first, second and third body subregions 1081, 1082, 1083 of the second conductivity type. The first body subregion 1081 adjoins the first gate dielectric 1051 and thus serves for forming a conductive channel when a suitable voltage is applied to the gate electrode 106. The second body subregion 1082 serves as vertical terminal region for a buried third body subregion 1083, which extends laterally as a deep body subregion below the drain extension region 103, wherein an extent of the deep body subregion 1083 in a first lateral direction x1 and an extent of the drain extension region 103 in the first lateral direction x1 at least partly overlap. The partial overlap has a positive effect on the blocking capability of the lateral field effect transistor cell on account of the compensation principle or RESURF (REduced SURface Field) principle. The extent of the third body subregion 1083 in the first lateral direction x1 and an extent of the gate electrode 106 in the first lateral direction x1 partly overlap.

Depending on whether the doping of the second body subregion 1082 at the first surface 109 is suitable for forming an ohmic contact, a highly doped body terminal region 1084 of the second conductivity type can be formed at the first surface 109 in order to electrically connect the first to third body subregions 1081, 1082, 1083 to the source terminal S. Besides the body region 108, the source region 109 is also electrically connected to the source terminal S. The electrical connection of body region 108 and source region 107 at the first surface 109 can be effected in diverse ways. In this context, reference is made to the explanations further above.

The source terminal S and the gate terminal G form a common terminal having a contact pad 111, e.g. a part of a wiring plane such as a metallization plane, and first and second electrical contacts 1121, 1122, wherein the first electrical contact 1121 extends through an intermediate dielectric 115 to the body region 108 or the source region 107 and the second contact 1122 extends through the intermediate dielectric 115 to the gate electrode 106.

The gate electrode 106 extends along the first lateral direction x1 beyond the termination of the first body subregion 1081 and overlaps the drain extension region 103. Between the drain extension region 103 and the gate electrode 106, the STI region 110 is formed as part of a further dielectric 116. In that part of the gate electrode 106 which overlaps the drain extension region 103, said gate electrode acts as a field plate 1062. The drain extension region 103 is electrically connected to the drain terminal D via a drain terminal region 113, e.g. a highly doped region of the first conductivity type, wherein the drain terminal D, in a similar manner to the source terminal S, comprises a third contact 1123 and a further contact pad 114. The contact pads 111, 114 can be formed for example by lithographic patterning of a single conductive layer or of a single layer stack such as a metal layer, a metal silicide layer or a highly doped semiconductor layer.

The further dielectric 116 likewise laterally adjoins the first gate dielectric 1051 of the first field effect transistor cell 101 and is additionally formed vertically between that part of the gate electrode 106 which acts as a field plate and the drain extension region 103 of the first planar field effect transistor cell 101, wherein a thickness of this part of the further dielectric 116 is greater than a thickness of the first gate dielectric 1051 of the first planar field effect transistor cell 101. The gate electrode 106 thus has a step along the lateral direction x2. The further dielectric 116, on account of its larger thickness in comparison with the first gate dielectric 1051, makes it possible to reduce the influence of the gate electrode on the conductivity in the semiconductor body outside the channel region.

The above embodiment relates, for instance, to the first field effect transistor cell 101 shown in FIG. 1 and interconnected as MGD, the drain extension region 103 of which first field effect transistor cell is suitable for blocking a drain-to-source voltage in a range of 5 V to 200 V. In the case of an n-channel field effect transistor cell, the interconnection of source and gate forms an anode and the drain terminal D forms a cathode.

Figure 5:
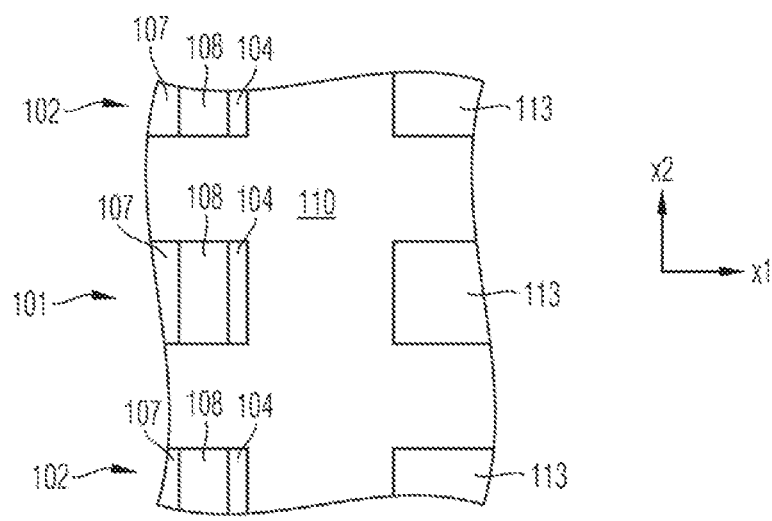
FIG. 5 shows an exemplary plan view of a first surface of a semiconductor body of a semiconductor device as shown in FIG. 1.

The plan view—illustrated in FIG. 5—of the first surface 109 of a semiconductor device such as, for instance, the semiconductor device 100 shown in FIG. 1 shows by way of example an alternating arrangement of first and second field effect transistor cells 101, 102 along the second lateral direction x2, which extends for instance along a channel width and is illustrated as strip or ring segment in FIG. 5.

In the exemplary plan view shown in FIG. 5, the first lateral direction x1 extends along a channel length direction of the channel region perpendicular to the channel width direction, which extends along the second lateral direction x2. The lateral dimensions of doped semiconductor regions of the first planar field effect transistor cell 101 along the first lateral direction x1 correspond to lateral dimensions of corresponding doped semiconductor regions of the second planar field effect transistor cell 102 along the first lateral direction x1. This is illustrated in the plan view shown in FIG. 5 by way of example on the basis of source region 107, body region 108 and drain terminal region 113.

The second planar field effect transistor cells 102 can be part of a lateral power transistor having a multiplicity of parallel-connected transistor cells that are suitable for switching load currents of greater than 100 mA. The semiconductor device can thus be used for example in a multiplicity of applications such as DC-DC converters, for instance, which necessitate for example switching or conducting currents of greater than 100 mA.

Figure 6:
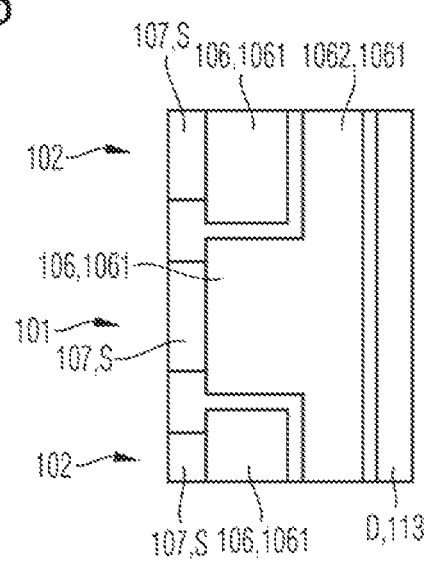
FIG. 6 shows a further plan view of a plane of the gate electrode of a semiconductor body of a semiconductor device as shown in FIG. 1.

With reference to the plan view shown in FIG. 6, an electrode material 1061 forming the gate electrode 106 of the first planar field effect transistor cell 101 extends from the gate electrode 106 of the first planar field effect transistor cell 101 to above the drain extension region 103 of the first planar field effect transistor cell 101 and forms there a field plate 1062 formed between the drain terminal D and the gate electrode 106 of the first planar field effect transistor cell 101. The electrode material 1061 can additionally extend further to the second field effect transistor cell 102 and also act as a field plate 1062 there.

Figure 7A:
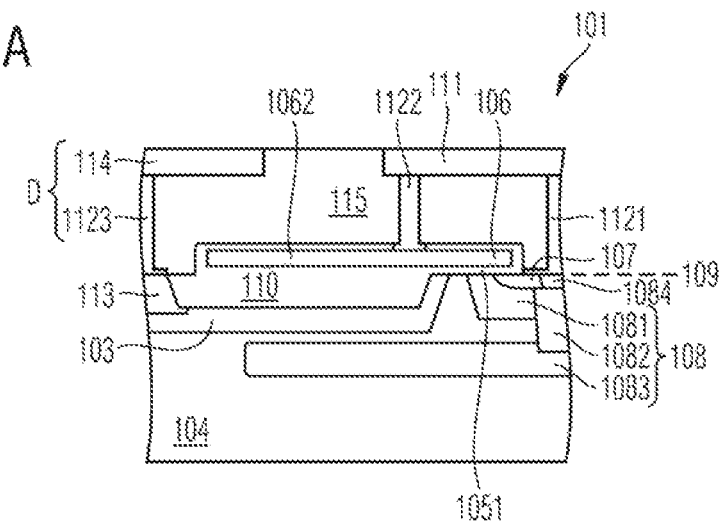

In accordance with the embodiment shown in the schematic cross-sectional view in FIG. 7A, the first gate dielectric 1051 extends laterally over the second body subregion 1082 as far as the STI region 110 and is formed vertically between the field plate 1062 and the drain extension region 103 of the first planar field effect transistor cell 101.

Figure 7B:
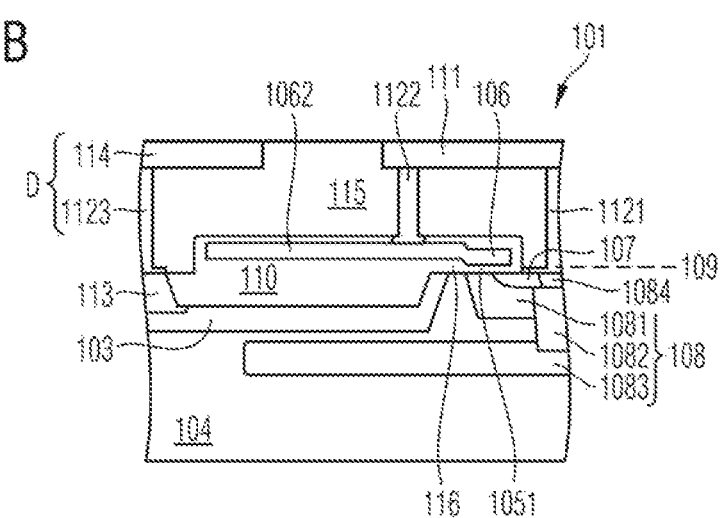

In the embodiment shown in accordance with the schematic cross-sectional view in FIG. 7B, in a similar manner to that in FIG. 4, the further dielectric 116 is formed as an STI region 110 and as a planar dielectric that laterally adjoins the gate dielectric 1051 of the first field effect transistor cell 101 and is positioned vertically between the field plate 1062 and the drain extension region 103 of the first planar field effect transistor cell, wherein a thickness of the planar field part of the further dielectric 116 is greater than a thickness of the gate dielectric 1051. The further dielectric 116 makes possible an improved electric field shielding.

Figure 7C:
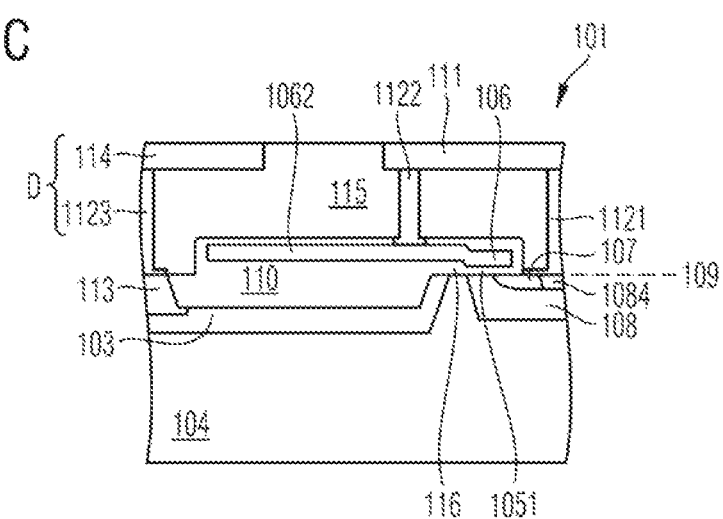

The embodiment shown in the schematic cross-sectional view in FIG. 7C has, in contrast to the embodiment shown in FIG. 7A, a simple body region 108 comprising no subregions such as, for instance, the third body subregion 1083 shown in FIG. 7B.

The embodiment shown in the schematic cross-sectional view in FIG. 7D has, in contrast to the embodiment shown in FIG. 7A, instead of the STI region 110, a LOCal Oxidation of Silicon, LOCOS, region 118 in order to improve the electric field shielding toward the first surface 109.

In the embodiment shown in the schematic cross-sectional view in FIG. 7E, the further dielectric 116 comprises, in contrast to the embodiment shown in FIG. 7A, instead of the STI region 110, a planar dielectric 120, the underside of which transitions into an underside of the first gate dielectric 1051 without any steps and the top side of which transitions into a top side of the first gate dielectric 1051 via a step 121 directed toward the first surface.

In the embodiment shown in the schematic cross-sectional view in FIG. 7F, the STI region 110 of the further dielectric 116 from FIG. 7A is replaced by a dielectric whose thickness increases in a direction toward the drain terminal D, whose underside extends parallel to the first surface 109 and whose top side falls obliquely with respect to the first surface 109 as far as the top side of the first gate dielectric 1051. It is thereby possible to achieve an electric field shielding adapted to the lateral voltage drop at the first surface 109.

Figure 8:
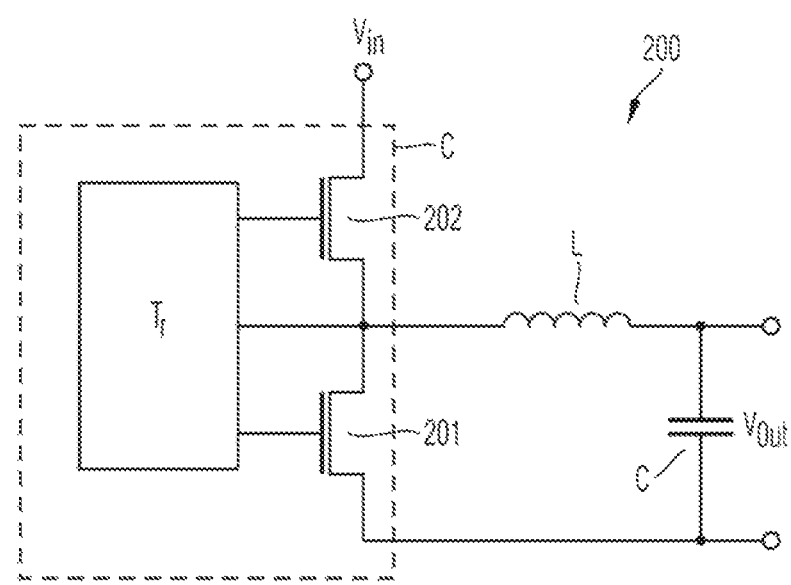
FIG. 8 shows a schematic circuit diagram of a DC-DC converter having field effect transistors that can be fashioned in accordance with the embodiments in FIGS. 1 to 7F.

The schematic diagram in FIG. 8 shows one application example in the form of a DC-DC converter 200, in which the field effect transistors 201, 202 can respectively be formed from the first and second field effect transistor cells 101, 102 described in the embodiments above. The DC-DC converter 200 additionally comprises a driver stage Tr and converts an input voltage Vin into an output voltage Vout by means of the field effect transistors 201, 202 and a downstream filter comprising a coil L and a capacitor C. The elements contained within the region C illustrated by dashed lines can be embodied for example as an integrated circuit.

Although specific embodiments have been illustrated and described herein, those skilled in the art will recognize that the specific embodiments shown and described can be replaced by a multiplicity of alternative and/or equivalent configurations, without departing from the scope of protection of the invention. The application is intended to cover any adaptations or variations of the specific embodiments discussed herein. Therefore, the invention is restricted only by the claims and the equivalents thereof.

What is claimed is:

1. A semiconductor device, comprising:
a first planar field effect transistor cell and a second planar field effect transistor cell electrically connected in parallel and each comprising a drain extension region between a channel region and a drain terminal at a first surface of a semiconductor body,
wherein a gate electrode of the first field effect transistor cell is electrically connected to a source terminal,
wherein a gate electrode of the second field effect transistor cell is connected to a gate terminal that is electrically isolated from the source terminal,
wherein an electrode material forming the gate electrode of the first planar field effect transistor cell extends from the gate electrode of the first planar field effect transistor cell to above the drain extension region of the second planar field effect transistor cell and forms there a field plate formed between the drain terminal and the gate electrode of the second planar field effect transistor cell, the semiconductor device further comprising:
a further dielectric laterally adjoining a gate dielectric of the first planar field effect transistor cell and formed vertically between the field plate and the drain extension region of the first planar field effect transistor cell, a thickness of the further dielectric being greater than a thickness of the gate dielectric of the first planar field effect transistor cell.

2. The semiconductor device of claim 1, wherein the drain extension region is configured to block a drain-to-source voltage in a range of 5 V to 200 V.

3. The semiconductor device of claim 1, further comprising:
a deep body region electrically connected to the source terminal and extending below the drain extension region of the first planar field effect transistor cell in a first lateral direction along a channel length direction of the channel region perpendicular to a channel width direction,
wherein the deep body region in the first lateral direction and the drain extension region in the first lateral direction at least partly overlap.

4. A semiconductor device, comprising:
a first planar field effect transistor cell comprising a drain extension region between a channel region and a drain terminal at a first surface of a semiconductor body; and
a second planar field effect transistor cell comprising a drain extension region between a channel region and a drain terminal at the first surface of the semiconductor body,
wherein a gate electrode of the first planar field effect transistor cell is electrically connected to a source terminal,
wherein the drain extension region of the first planar field effect transistor cell is configured to block a drain-to-source voltage in a range of 5 V to 200 V,
wherein a gate electrode of the second planar field effect transistor cell is connected to a gate terminal that is electrically isolated from the source terminal,
wherein the drain extension region of the second planar field effect transistor cell is configured to block a drain-to-source voltage in a range of 5 V to 200 V,
wherein an electrode material forming the gate electrode of the first planar field effect transistor cell extends from the gate electrode of the first planar field effect transistor cell to above the drain extension region of the second planar field effect transistor cell and forms there a field plate formed between the drain terminal and the gate electrode of the second planar field effect transistor cell, the semiconductor device further comprising:
a further dielectric laterally adjoining a gate dielectric of the first planar field effect transistor cell and formed vertically between the field plate and the drain extension region of the first planar field effect transistor cell, a thickness of the further dielectric being greater than a thickness of the gate dielectric of the first planar field effect transistor cell.

5. The semiconductor device of claim 4, wherein a first thickness of the gate dielectric arranged on the channel region of the first planar field effect transistor cell is less than a second thickness of a second gate dielectric arranged on the channel region of the second planar field effect transistor cell.

6. The semiconductor device of claim 5, wherein a ratio of the second thickness to the first thickness lies in a range of 2 to 20.

7. The semiconductor device of claim 4, wherein a body region of the first planar field effect transistor cell and a body region of the second planar field effect transistor cell, from opposite sides, laterally adjoin a component isolation region formed between the first planar field effect transistor cell and the second planar field effect transistor cell.

8. The semiconductor device of claim 4, wherein a first lateral direction extends along a channel length direction of the channel region perpendicular to a channel width direction, and wherein lateral dimensions of doped semiconductor regions of the first planar field effect transistor cell along the first lateral direction correspond to lateral dimensions of corresponding doped semiconductor regions of the second planar field effect transistor cell along the first lateral direction.

9. The semiconductor device of claim 4, wherein an electrode material forming the gate electrode of the first planar field effect transistor cell extends from the gate electrode of the first planar transistor cell to above the drain extension region of the second planar field effect transistor cell and forms there a field plate formed between the drain terminal and the gate electrode of the second planar field effect transistor cell.

10. The semiconductor device of claim 4, wherein the second planar field effect transistor cell is part of a lateral power transistor having a multiplicity of parallel-connected transistor cells that are configured for switching load currents of greater than 100 mA.

11. The semiconductor device of claim 4, wherein a threshold voltage of the first planar field effect transistor cell is less than a forward voltage of a body-drain diode of the first planar field effect transistor cell.

12. The semiconductor device of claim 4, wherein the further dielectric comprises a shallow trench isolation dielectric.

13. The semiconductor device of claim 12, wherein the further dielectric between the shallow trench isolation dielectric and the gate dielectric of the first planar field effect transistor cell comprises a planar dielectric that is thicker than the gate dielectric.

14. The semiconductor device of claim 4, wherein a part of the gate dielectric of the first planar field effect transistor cell at the first surface adjoins a top side of a part of the drain extension region.

15. The semiconductor device of claim 4, wherein the further dielectric is a LOCOS (Local Oxidation of Silicon) oxide.

16. The semiconductor device of claim 4, wherein the further dielectric is a planar dielectric, wherein an underside of the further dielectric transitions into an underside of the gate dielectric of the first planar field effect transistor cell without any steps, and wherein a top side of the further dielectric transitions into a top side of the gate dielectric of the first planar field effect transistor cell via a step directed toward the first surface.

17. The semiconductor device of claim 4, wherein a thickness of the further dielectric increases in a direction toward the drain terminal, wherein an underside of the further dielectric extends parallel to the first surface, and wherein a top side of the further dielectric falls obliquely with respect to the first surface as far as the top side of the gate dielectric of the first planar field effect transistor cell.

18. A DC-DC converter comprising the semiconductor device of claim 4.

* * * * *

UNITED STATES PATENT AND TRADEMARK OFFICE
CERTIFICATE OF CORRECTION

PATENT NO. : 10,985,245 B2
APPLICATION NO. : 16/220693
DATED : April 20, 2021
INVENTOR(S) : A. Meiser et al.

Page 1 of 1

It is certified that error appears in the above-identified patent and that said Letters Patent is hereby corrected as shown below:

On the Title Page

Item (56) page 2, Column 2, Line 30, please change "20180090455 Brecfi" to -- 20180090455 Brech --

Signed and Sealed this
Twenty-ninth Day of June, 2021

Drew Hirshfeld
*Performing the Functions and Duties of the
Under Secretary of Commerce for Intellectual Property and
Director of the United States Patent and Trademark Office*